United States Patent
Hamouda

(10) Patent No.: US 10,345,694 B2
(45) Date of Patent: Jul. 9, 2019

(54) MODEL-BASED GENERATION OF DUMMY FEATURES

(71) Applicant: GLOBALFOUNDRIES INC., Grand Cayman (KY)

(72) Inventor: Ayman Hamouda, Fishkill, NY (US)

(73) Assignee: BLOBALFOUNDRIES INC., Grand Cayman (KY)

( * ) Notice: Subject to any disclaimer, the term of this patent is extended or adjusted under 35 U.S.C. 154(b) by 29 days.

(21) Appl. No.: 15/658,721

(22) Filed: Jul. 25, 2017

(65) Prior Publication Data
US 2017/0322486 A1     Nov. 9, 2017

Related U.S. Application Data

(63) Continuation of application No. 14/467,489, filed on Aug. 25, 2014, now Pat. No. 9,740,092.

(51) Int. Cl.
*G03F 1/36*     (2012.01)
*G06F 17/50*    (2006.01)
*G03F 1/00*     (2012.01)

(52) U.S. Cl.
CPC ............ *G03F 1/36* (2013.01); *G06F 17/5081* (2013.01); *G03F 1/144* (2013.01); *G06F 17/5068* (2013.01)

(58) Field of Classification Search
CPC ........ G03F 1/144; G03F 1/36; G06F 17/5081; G06F 17/5068
USPC ................................ 716/50–56, 122; 326/41
See application file for complete search history.

(56) References Cited

U.S. PATENT DOCUMENTS

| | | | |
|---|---|---|---|
| 6,833,622 B1* | 12/2004 | Zagrebelny | H01L 21/31053 257/752 |
| 7,252,909 B2* | 8/2007 | Shin | G03F 7/70433 430/5 |
| 7,254,792 B1* | 8/2007 | Rekhi | G06F 17/5009 716/115 |
| 8,037,429 B2 | 10/2011 | Shang et al. | |
| 8,732,625 B2 | 5/2014 | Ye et al. | |
| 2008/0121939 A1* | 5/2008 | Murray | G03F 1/36 257/202 |

(Continued)

OTHER PUBLICATIONS

Office Action dated Dec. 2, 2015 from co-pending U.S. Appl. No. 14/467,489.

(Continued)

*Primary Examiner* — Stacy Whitmore
(74) *Attorney, Agent, or Firm* — Williams Morgan, P.C.

(57) ABSTRACT

Approaches herein provide model-based generation of dummy features used during processing of a semiconductor device (e.g., during a self-aligned via process). Specifically, at least one approach includes: generating a set of dummy features in proximity to a set of target features in a mask layout, evaluating a proximity of the set of dummy features to a metal layer of the semiconductor device, and removing a portion of the set of dummy features that is present within an established critical distance between the set of dummy features and the metal layer. Target design printability is further enhanced during photolithography by performing one or more of the following: merging two or more dummy features of the set of dummy features, and increasing a distance between adjacent dummy features of the set of dummy features by modifying a geometry of one or more of the set of dummy features.

17 Claims, 6 Drawing Sheets

(56) References Cited

U.S. PATENT DOCUMENTS

| | | | | |
|---|---|---|---|---|
| 2008/0296700 | A1* | 12/2008 | Kang | H01L 21/823437 257/390 |
| 2010/0287520 | A1* | 11/2010 | Nitta | G06F 17/5068 716/130 |
| 2012/0110524 | A1 | 5/2012 | Grant et al. | |
| 2013/0183832 | A1* | 7/2013 | Landis | G03F 1/36 438/758 |
| 2014/0367855 | A1* | 12/2014 | Rieger | H01L 21/76877 257/741 |

OTHER PUBLICATIONS

Office Action dated Aug. 26, 2016 from co-pending U.S. Appl. No. 14/467,489.
Final Office Action dated Jan. 6, 2017 from co-pending U.S. Appl. No. 14/467,489.

* cited by examiner

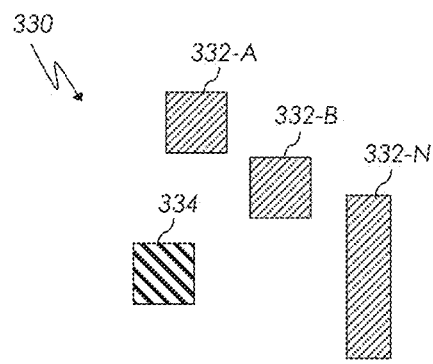
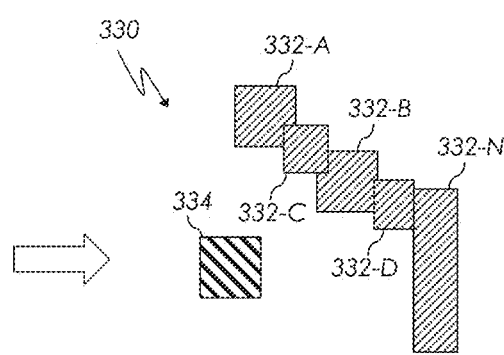
FIG. 3(A)　　　　　　　FIG. 3(B)
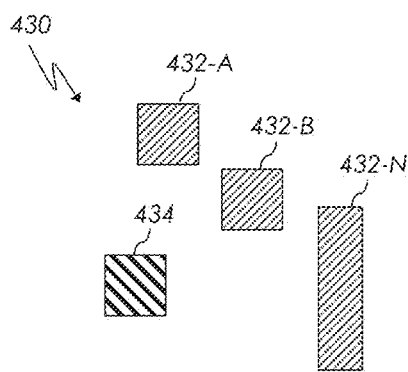
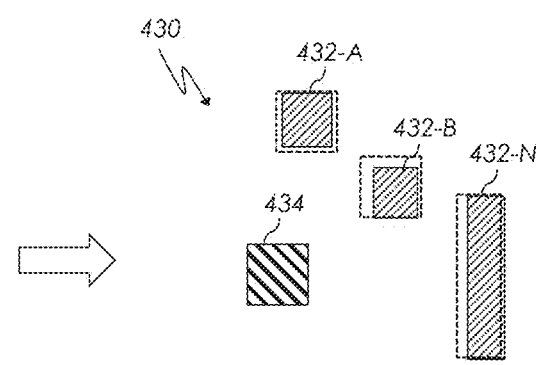
FIG. 4(A)　　　　　　　FIG. 4(B)

MODEL-BASED GENERATION OF DUMMY FEATURES

BACKGROUND

Technical Field

This invention relates generally to the field of semiconductor photolithography and, more particularly, to model-based generation of dummy features for improved target design printability.

Related Art

In conventional photolithographic processing, integrated circuits are created on a semiconductor wafer by exposing the wafer with a pattern of features on a mask or reticle. The pattern of features selectively exposes photosensitive chemicals on a wafer that is then further chemically and mechanically processed to build up layers of the integrated circuit.

As the features on a mask become smaller and smaller, optical distortions can occur whereby the exposure pattern created on a wafer will not match the pattern of features on the mask. To correct this, numerous resolution enhancement techniques (RETs) may be employed to improve the image quality so that the exposure pattern on a wafer more faithfully matches the pattern of features desired. Such RETs often comprise making extensive changes to the corresponding pattern of features on a mask to compensate for the known distortions in the imaging process.

With conventional resolution enhancement techniques, data for a pattern of mask features are analyzed with a computer program to estimate how a corresponding pattern of features will print on a mask. The data for the individual mask features or portions thereof may be adjusted such that the pattern created on the wafer will more faithfully match the desired layout. In addition, features, such as sub-resolution assist features (SRAFs), may be added to the layout data as necessary to improve printing fidelity. Typically, SRAFs are non-printing shapes (e.g., rectangles) that are positioned adjacent to an edge of a feature in order to improve the contrast of the feature, which assists/improves the process during photolithography. The shape, size, and placement of the SRAFs may be predetermined, and often follow simple geometric rules. It is generally desirable to use an aggressive SRAF strategy (e.g., larger SRAF elements) to improve the imaging quality during photolithography, and to improve the pattern transfer immunity against photolithography process variations.

Typically, SRAFs are prevented from printing because, for some levels, a printing SRAF can be a defect that contributes to random defect generation (e.g., when a printing SRAF forms a resist line). Furthermore, multiple stacked printing SRAFs in integrated levels can form an unintended electrical path to signals that can alter or even destroy the circuit behavior.

In one prior art approach, SRAF printing is enabled using a gridded pitch having an optimized RET (illumination/source distribution). This approach incorporates a trim mask, which allows the SRAF to be printed, because the SRAFs are subsequently removed during a trimming phase. Unfortunately, this approach is constrained by the presence of the trim mask, which is not always desired.

SUMMARY

In general, approaches herein provide model-based generation of dummy features used during processing of a semiconductor device (e.g., during a self-aligned via process). Specifically, at least one approach includes: generating a set of dummy features in proximity to a set of target features in a mask layout, evaluating a proximity of the set of dummy features to a metal layer of the semiconductor device, and removing a portion of the set of dummy features that is present within an established critical distance between the set of dummy features and the metal layer. Target design printability is further enhanced during photolithography by performing one or more of the following: merging two or more dummy features of the set of dummy features, and increasing a distance between adjacent dummy features of the set of dummy features by modifying a geometry of one or more of the set of dummy features. The dummy features are then merged with the designed targets, and passed for SRAF generation and optical process correction (OPC). The merged dummy targets and design targets in OPC ensures that dummy targets will consistently print in various process window (PW) conditions and, accordingly, not cause any apparent defects during defect inspection.

One aspect of the present invention includes a method for providing model-based generation of dummy features, the method comprising: generating a set of dummy features in proximity to a set of target features in a mask layout; evaluating a proximity of the set of dummy features to a metal layer of a semiconductor device; and removing a portion of the set of dummy features that is present within an established critical distance between the set of dummy features and the metal layer.

Another aspect of the present invention includes a computer program product for providing model-based generation of dummy features, the computer program product comprising: a computer readable storage device storing computer program instructions, the computer program instructions being executable by a model generator, the computer program instructions including: generating a set of dummy features in proximity to a set of target features in a mask layout; evaluating a proximity of the set of dummy features to a metal layer of a semiconductor device; and removing a portion of the set of dummy features that is present within an established critical distance between the set of dummy features and the metal layer.

Another aspect of the present invention includes a system for model-based generation of dummy features, the computer system comprising: a memory medium comprising program instructions; a bus coupled to the memory medium; and a processor, for executing the program instructions, coupled to a model generator via the bus that when executing the program instructions causes the system to: generate a set of dummy features in proximity to a set of target features in a mask layout; evaluate a proximity of the set of dummy features to a metal layer of a semiconductor device; and remove a portion of the set of dummy features that is present within an established critical distance between the set of dummy features and the metal layer.

BRIEF DESCRIPTION OF THE DRAWINGS

These and other features of this invention will be more readily understood from the following detailed description of the various aspects of the invention taken in conjunction with the accompanying drawings in which:

FIG. 3(A) shows the set of dummy features and the set of target features according to illustrative embodiments;

FIG. 3(B) shows merging of the set of dummy features according to illustrative embodiments;

FIG. 4(A) shows the set of dummy features and the set of target features according to illustrative embodiments;

FIG. 4(B) shows an approach for increasing a distance between adjacent dummy features of the set of dummy features by modifying a geometry of one or more of the set of dummy features according to illustrative embodiments;

Figure 1:
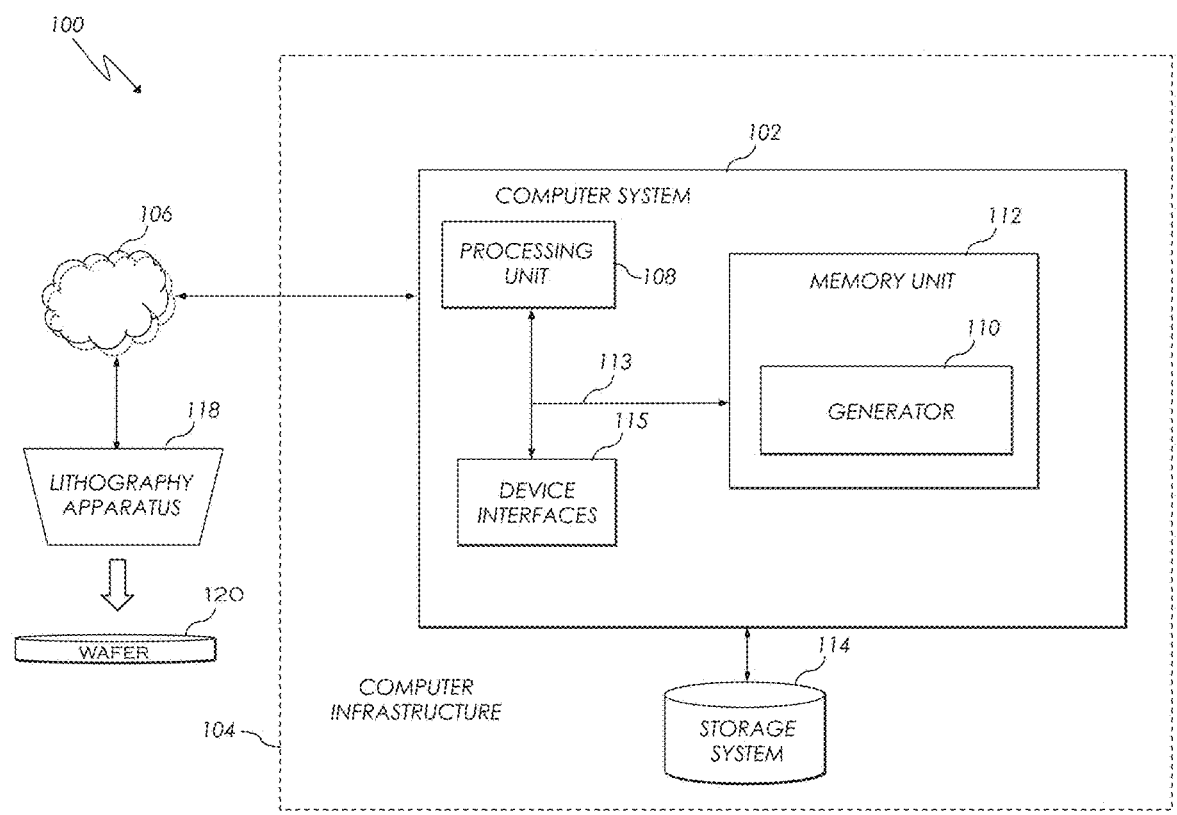
FIG. 1 shows a schematic of an exemplary computing environment according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g., a second layer, wherein intervening elements, such as an interface structure, e.g. interface layer, may be present between the first element and the second element.

As mentioned above, approaches herein provide model-based generation of dummy features used during processing of a semiconductor device (e.g., during a self-aligned via process). Specifically, at least one approach includes: generating a set of dummy features in proximity to a set of target features in a mask layout, evaluating a proximity of the set of dummy features to a metal layer of the semiconductor device, and removing a portion of the set of dummy features that is present within an established critical distance between the set of dummy features and the metal layer. Target design printability is further enhanced during photolithography by performing one or more of the following: merging two or more dummy features of the set of dummy features, and increasing a distance between adjacent dummy features of the set of dummy features by modifying a geometry of one or more of the set of dummy features. The dummy features are then merged with the designed targets, and passed for SRAF generation and optical process correction (OPC). The merged dummy targets and design targets in OPC ensures that dummy targets will consistently print in various process window conditions and, accordingly, not cause any apparent defects during defect inspection.

With reference now to the figures, FIG. 1 depicts a system 100 that facilitates model-based generation of dummy features used during processing of a semiconductor device (e.g., during a self-aligned via process). As shown, system 100 includes computer system 102 deployed within a computer infrastructure 104. This is intended to demonstrate, among other things, that embodiments can be implemented within a network environment 106 (e.g., the Internet, a wide area network (WAN), a local area network (LAN), a virtual private network (VPN), etc.), a cloud-computing environment, or on a stand-alone computer system. Still yet, computer infrastructure 104 is intended to demonstrate that some or all of the components of system 100 could be deployed, managed, serviced, etc., by a service provider who offers to implement, deploy, and/or perform the functions of the present invention for others.

Computer system 102 is intended to represent any type of computer system that may be implemented in deploying/realizing the teachings recited herein. In this particular example, computer system 102 represents an illustrative system for model-based generation of dummy features used during processing of a semiconductor device (e.g., during a self-aligned via process). It should be understood that any other computers implemented under various embodiments may have different components/software, but will perform similar functions. As shown, computer system 102 includes a processing unit 108 capable of operating with a generator 110 stored in a memory unit 112 to provide model-based generation of dummy features, as will be described in further detail below. Also shown is a bus 113, and device interfaces 115.

Processing unit 108 refers, generally, to any apparatus that performs logic operations, computational tasks, control functions, etc. A processor may include one or more subsystems, components, and/or other processors. A processor will typically include various logic components that operate using a clock signal to latch data, advance logic states, synchronize computations and logic operations, and/or provide other timing functions. During operation, processing unit 108 receives signals transmitted over a LAN and/or a WAN (e.g., T1, T3, 56 kb, X.25), broadband connections (ISDN, Frame Relay, ATM), wireless links (802.11, Bluetooth, etc.), and so on. In some embodiments, the signals may be encrypted using, for example, trusted key-pair encryption. Different systems may transmit information using different communication pathways, such as Ethernet or wireless networks, direct serial or parallel connections, USB, Firewire®, Bluetooth®, or other proprietary interfaces. (Firewire is a registered trademark of Apple Computer, Inc. Bluetooth is a registered trademark of Bluetooth Special Interest Group (SIG)).

In general, processing unit 108 executes computer program code, such as program code for operating generator 110, which is stored in memory unit 112 and/or storage system 114. While executing computer program code, processing unit 108 can read and/or write data to/from memory unit 112 and storage system 114. Storage system 114 may comprise VCRs, DVRs, RAID arrays, USB hard drives, optical disk recorders, flash storage devices, and/or any other data processing and storage elements for storing and/or processing data. Although not shown, computer system 102 could also include I/O interfaces that communicate with one or more hardware components of computer infrastructure 104 that enable a user to interact with computer system 102 (e.g., a keyboard, a display, camera, etc.). As will be described in further detail below, generator 110 of computer infrastructure 104 is configured to operate with a lithography apparatus 118 for patterning features of a semiconductor device.

Although not shown in detail for the sake of brevity, it will be appreciated that in an exemplary embodiment, lithography apparatus 118 may comprise an illumination system (illuminator) configured to condition a radiation beam (e.g. UV radiation or DUV radiation); a support structure (e.g., a mask table) constructed to hold a patterning device (e.g., a mask); a substrate table (e.g., a wafer table) constructed to hold a wafer 120 (e.g., a resist-coated wafer); and a projection system (e.g., a refractive projection lens system) configured to project a pattern imparted to the radiation beam by patterning device onto a target portion (e.g. comprising one or more dies) of the substrate.

The illumination system of lithography apparatus 118 may include various types of optical components, such as refractive, reflective, magnetic, electromagnetic, electrostatic or other types of optical components, or any combination thereof, for directing, shaping, or controlling radiation. The support structure holds the patterning device in a manner that depends on the orientation of the patterning device, the design of the lithographic apparatus, and other conditions, such as, for example, whether or not the patterning device is held in a vacuum environment. The support structure can use mechanical, vacuum, electrostatic or other clamping techniques to hold the patterning device.

Figure 2:
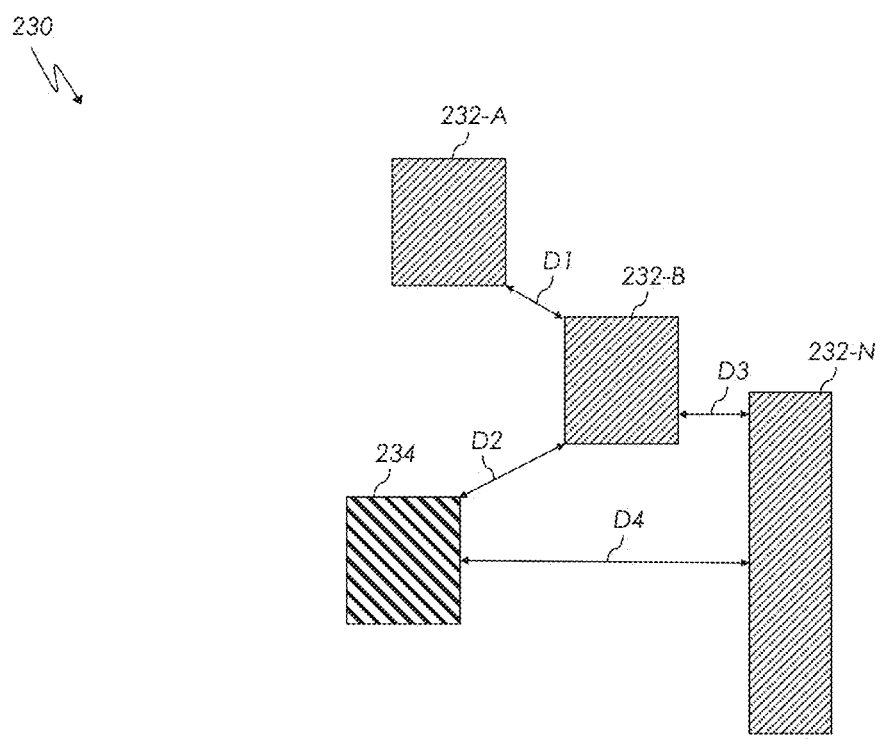
FIG. 2 shows a set of dummy features and a set of target features according to illustrative embodiments.

Referring now to FIG. 2, an approach for model-based generation of dummy features used during processing of a semiconductor device will be described in greater detail. As shown, a mask layout 230 is provided, including a set (i.e., one or more) of dummy features 232A-N in proximity to a set of target features 234. To enhance the robustness of the target design printability during photolithography, both the size and location of each dummy feature 232A-N and target feature 234 should be carefully considered. In terms of dummy feature size, generator 110 (FIG. 1) is configured to define a minimum dummy size that is slightly less than the target, yet large enough to enable robust printing. In terms of dummy feature location, generator 110 is configured to define distances between corners (e.g., D1 and D2), and distances between edges (e.g., D3 and D4). These values (i.e., edge-to-edge spacing and corner-to corner spacing) and associated rules are selected based on a desired distance between each of dummy features 232A-N and target feature 234. In one embodiment, the edge-to-edge spacing between dummy features 232B and 232-N (i.e., D3) is less than the edge-to-edge spacing between dummy feature 232-N and target feature 234 (i.e., D4). Similarly, the corner-to-corner spacing between dummy features 232-A and 232-B (i.e., D1) is greater than the corner-to-corner spacing between dummy feature 232-B and target feature 234 (i.e., D2). Furthermore, in an exemplary embodiment, the dummy-to-dummy rules should be small enough to allow for as many clean dummy features as possible to improve the process window of target feature 234.

Referring now to FIGS. 3(A)-(B), set of dummy features 332A-N and set of target features 334 are shown, wherein two or more dummy features are merged/connected according to illustrative embodiments. As shown, dummy features 332A-N are merged together by adding additional dummy features 332-C and 332-D. This inclusion of dummy features 332C-D resolves issues created by through-PW bridging, which may occur if the spacing between the generated dummy features shown in FIG. 3(A) is not resolvable.

In another approach shown in FIGS. 4(A)-(5(B), dummy features 432A-N can be improved by increasing a distance between adjacent dummy features, e.g., by modifying a geometry of one or more dummy features 432A-N. That is, dummy features 432A-N shown in FIG. 4(A) undergo a reduction in area resulting in the dummy features 432A-N shown in FIG. 4(B), which are generally smaller in size/shape to allow more distance between adjacent dummy features.

Figure 5A:
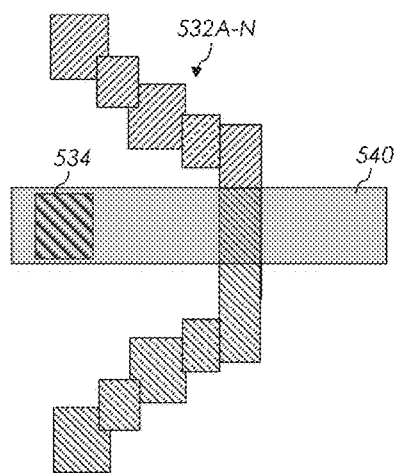
FIG. 5(A) shows a proximity of the set of dummy features to a metal layer of the semiconductor device according to illustrative embodiments.
Figure 5B:
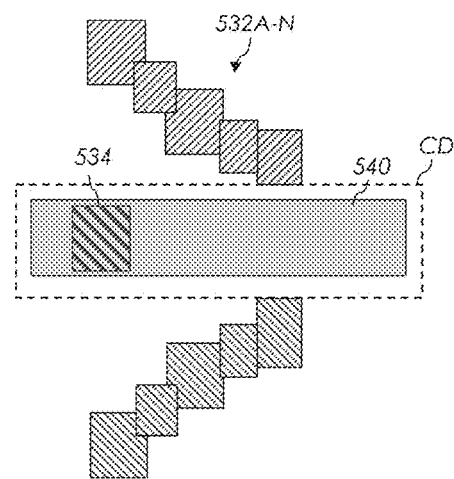
FIG. 5(B) shows removal of a portion of the set of dummy features that is present within an established critical distance between the set of dummy features and the metal layer according to illustrative embodiments.

As processing continues, precautions are taken so that the dummy features do not print on the final wafer. In the case of a SAV process, this can be achieved by preventing the dummy features from printing near a metal feature with the semiconductor device located above. As shown in FIGS. 5(A)-(B), proximity of dummy features 532A-N to a metal layer 540 is evaluated to determine if any dummy features are interacting with metal 540. As shown in FIG. 5(B), a critical distance CD (represented by broken line) is established around metal layer 540. The choice of the sizing of CD may take into consideration several factors, including via (i.e., target feature 534) and metal etch biases, overlay error, and process variability of both metal layer 540 and the via. Once selected, any portion of dummy features 532A-N present within the CD is removed, as demonstrated by FIG. 5(B).

Figure 6:
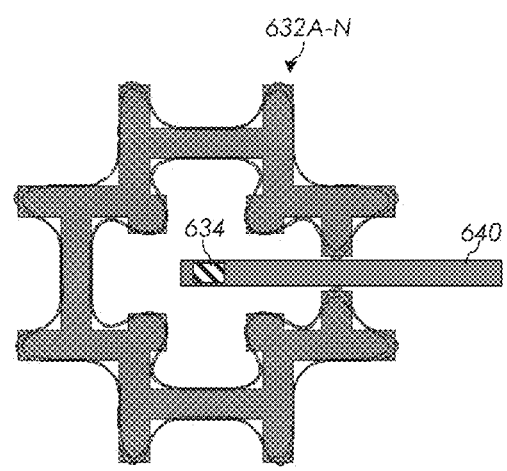
FIG. 6 shows merging of dummy and target features according to illustrative embodiments.
Figure 7:
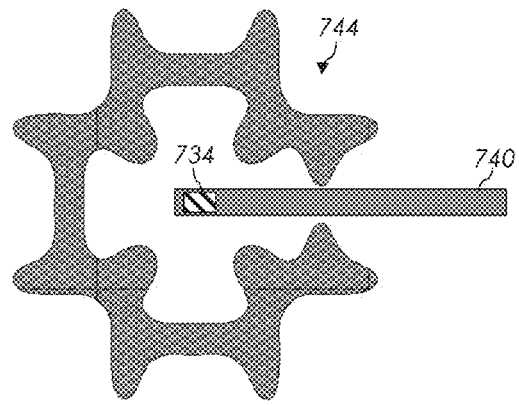
FIG. 7 shows generation of a set of SRAFs according to illustrative embodiments.

As shown in FIG. 6, dummy features 632A-N are then merged together with target feature 634, which in this case is a self-aligned via, and passed along for generation of a set of SRAFs 744, as shown in FIG. 7. In a preferred embodiment, OPC is also performed for SRAFs 744 to adjust the placement of feature edges when the lithographic response value converges substantially to a desired value. OPC alters the physical design to compensate for distortions caused by effects such as optical diffraction and the optical interaction of features with proximate features. OPC includes all resolution enhancement technologies performed with a reticle.

It will be appreciated that the approaches described herein have at least the following benefits. They reduce issues that arise during defectivity scans due to overloading, identify the key aspects of the successful generation of such dummy features, including the proper selection of the generation parameters and cleanup operations, and prevent dummy printing on the final wafer by considering the metal above in a SAV process. Furthermore, merging the model-based dummy targets with design targets in OPC ensures that dummy targets consistently print in various PW conditions and, accordingly, do not cause significant defects during defect inspection. As a result, improvement up to approximately 50% in PV bandwidth can be achieved.

It can be appreciated that the approaches disclosed herein can be used within a computer system to provide model-based generation of dummy features during processing of a semiconductor device. In this case, as shown in FIG. 1, generator 110 can be provided, and one or more systems for performing the processes described in the invention can be obtained and deployed to computer system 102 (FIG. 1). To this extent, the deployment can comprise one or more of (1) installing program code on a computing device, such as a computer system, from a computer-readable storage medium; (2) adding one or more computing devices to the infrastructure; and (3) incorporating and/or modifying one or more existing systems of the infrastructure to enable the infrastructure to perform the process actions of the invention.

The exemplary computer system 102 (FIG. 1) may be described in the general context of computer-executable instructions, such as program modules, being executed by a computer. Generally, program modules include routines, programs, people, components, logic, data structures, and so on, which perform particular tasks or implement particular abstract data types. Exemplary computer system 102 may be practiced in distributed computing environments where tasks are performed by remote processing devices that are linked through a communications network. In a distributed computing environment, program modules may be located in both local and remote computer storage media including memory storage devices.

Figure 8:
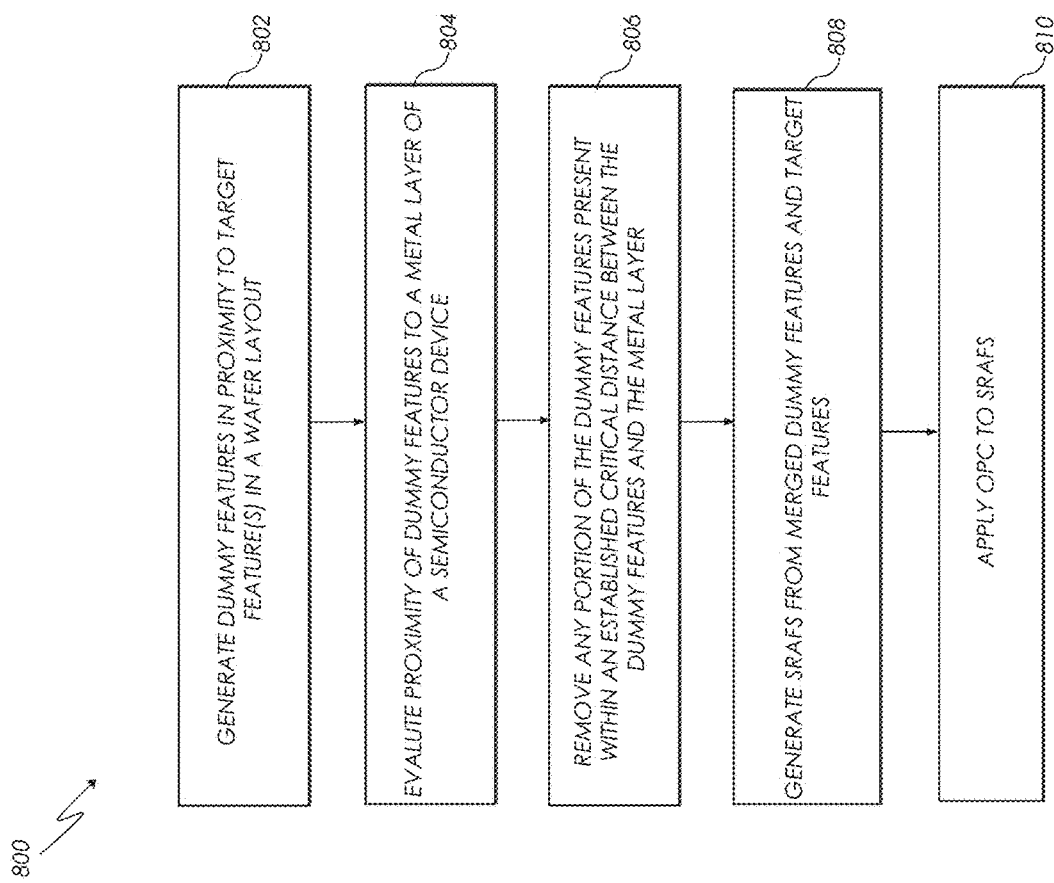
FIG. 8 shows a process flow for providing model-based generation of dummy features during processing of a semiconductor device according to illustrative embodiments.

As depicted in FIG. 8, a system (e.g., computer system 102) carries out the methodologies disclosed herein. Shown is a process flow 800 for providing model-based generation of dummy features during device processing. At 802, a set of dummy features is generated in proximity to a set of target features in a mask layout. At 804, a proximity of the set of dummy features to a metal layer of the semiconductor device is evaluated. At 806, a portion of the set of dummy features present within an established critical distance between the set of dummy features and the metal layer is removed. At 808, SRAFs are generated from merged dummy and target features. At 810, OPC is applied to the SRAFs.

Process flow 800 of FIG. 8 illustrates the architecture, functionality, and operation of possible implementations of systems, methods, and computer program products according to various embodiments of the present invention. In this regard, each block in the flowchart may represent a module, segment, or portion of code, which comprises one or more executable instructions for implementing the specified logical function(s). It should also be noted that, in some alternative implementations, the functions noted in the blocks might occur out of the order depicted in the figures. For example, two blocks shown in succession may, in fact, be executed substantially concurrently. It will also be noted that each block of flowchart illustration can be implemented by special purpose hardware-based systems that perform the specified functions or acts, or combinations of special purpose hardware and computer instructions.

Some of the functional components described in this specification have been labeled as systems or units in order to more particularly emphasize their implementation independence. For example, a system or unit may be implemented as a hardware circuit comprising custom VLSI circuits or gate arrays, off-the-shelf semiconductors such as logic chips, transistors, or other discrete components. A system or unit may also be implemented in programmable hardware devices such as field programmable gate arrays, programmable array logic, programmable logic devices or the like. A system or unit may also be implemented in software for execution by various types of processors. A system or unit or component of executable code may, for instance, comprise one or more physical or logical blocks of computer instructions, which may, for instance, be organized as an object, procedure, or function. Nevertheless, the executables of an identified system or unit need not be physically located together, but may comprise disparate instructions stored in different locations which, when joined logically together, comprise the system or unit and achieve the stated purpose for the system or unit.

Further, a system or unit of executable code could be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices and disparate memory devices.

Furthermore, systems/units may also be implemented as a combination of software and one or more hardware devices. For instance, input controller 118 may be embodied in the combination of a software executable code stored on a memory medium (e.g., memory storage device). In a further example, a system or unit may be the combination of a processor that operates on a set of operational data.

As noted above, some of the embodiments may be embodied in hardware. The hardware may be referenced as a hardware element. In general, a hardware element may refer to any hardware structures arranged to perform certain operations. In one embodiment, for example, the hardware elements may include any analog or digital electrical or electronic elements fabricated on a substrate. The fabrication may be performed using silicon-based integrated circuit (IC) techniques, such as complementary metal oxide semiconductor (CMOS), bipolar, and bipolar CMOS (BiCMOS) techniques, for example. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor devices, chips, microchips, chip sets, and so forth. However, the embodiments are not limited in this context.

Also noted above, some embodiments may be embodied in software. The software may be referenced as a software element. In general, a software element may refer to any software structures arranged to perform certain operations. In one embodiment, for example, the software elements may include program instructions and/or data adapted for execution by a hardware element, such as a processor. Program instructions may include an organized list of commands comprising words, values, or symbols arranged in a predetermined syntax that, when executed, may cause a processor to perform a corresponding set of operations.

The present invention may also be a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

It is apparent that there has been provided approaches for providing model-based generation of dummy features during device processing. While the invention has been particularly shown and described in conjunction with exemplary embodiments, it will be appreciated that variations and modifications will occur to those skilled in the art. Therefore, it is to be understood that the appended claims are intended to cover all such modifications and changes that fall within the true spirit of the invention.

What is claimed is:

1. A semiconductor device, comprising,
    a metal layer,
    a set of target features, and
    a set of dummy features, wherein the location of each dummy feature of the set of dummy features is based on a desired distance between each dummy feature and each target feature of the set of target features, and wherein each dummy feature is disposed at further than an established critical distance from the metal layer.

2. The semiconductor device of claim 1, wherein the metal layer is located above the set of dummy features.

3. The semiconductor device of claim 1, wherein the set of target features comprises one or more vias.

4. The semiconductor device of claim 3, wherein the set of target features consists of one or more vias.

5. The semiconductor device of claim 1, wherein each dummy feature has a shape selected from a square or a rectangle.

6. A semiconductor device, comprising,
a metal layer,
a target feature, and
a set of merged dummy features, wherein the location of each dummy feature of the set of merged dummy features is based on a desired distance between each dummy feature and the target feature, and wherein the set of merged dummy features is disposed at further than an established critical distance from the metal layer.

7. The semiconductor device of claim 6, wherein the metal layer is located above the set of dummy features.

8. The semiconductor device of claim 6, wherein the target feature is a via.

9. The semiconductor device of claim 8, wherein the via is a self-aligned via.

10. The semiconductor device of claim 5, wherein the set of merged dummy features comprises at least one rounded corner.

11. A semiconductor device, comprising,
a metal layer,
a via, and
a set of dummy features, wherein the location of each dummy feature of the set of dummy features is based on a desired distance between each dummy feature and the via, and wherein each dummy feature is disposed at further than an established critical distance from the metal layer.

12. The semiconductor device of claim 11, wherein the via is a self-aligned via.

13. The semiconductor device of claim 11, wherein the metal layer is located above the set of dummy features.

14. The semiconductor device of claim 11, wherein each dummy feature has a shape selected from a square or a rectangle.

15. The semiconductor device of claim 14, wherein a first dummy feature of the set of dummy features is a square and a second dummy feature of the set of dummy features is a triangle.

16. The semiconductor device of claim 11, wherein the set of dummy features is merged.

17. The semiconductor device of claim 16, wherein the set of merged dummy features comprises at least one rounded corner.

* * * * *